(12) United States Patent
Suhonen

(10) Patent No.: US 7,283,801 B2
(45) Date of Patent: Oct. 16, 2007

(54) CIRCUIT ARRANGEMENT FOR PHASE LOCKED LOOP, AND PHASE LOCKED LOOP BASED METHOD TO BE USED IN CELLULAR NETWORK TERMINALS

(75) Inventor: Markus Suhonen, Oulu (FI)

(73) Assignee: Nokia Corporation, Espoo (FI)

( * ) Notice: Subject to any disclaimer, the term of this patent is extended or adjusted under 35 U.S.C. 154(b) by 391 days.

(21) Appl. No.: 10/429,493

(22) Filed: May 5, 2003

(65) Prior Publication Data

US 2003/0220087 A1  Nov. 27, 2003

(30) Foreign Application Priority Data

May 27, 2002 (FI) .................................. 20020988

(51) Int. Cl.
*H04B 1/16* (2006.01)
(52) U.S. Cl. ................ 455/343.4; 455/343.1; 455/260
(58) Field of Classification Search ........... 455/260, 455/343.1–343.6
See application file for complete search history.

(56) References Cited

U.S. PATENT DOCUMENTS

| | | | | |
|---|---|---|---|---|
| 4,893,094 A * | 1/1990 | Herold et al. ............... 331/1 A |
| 5,202,906 A * | 4/1993 | Saito et al. .................. 331/14 |
| 5,355,098 A | 10/1994 | Iwasaki ...................... 331/14 |
| 5,379,002 A * | 1/1995 | Jokura ........................ 331/10 |
| 5,475,877 A * | 12/1995 | Adachi ................... 455/343.2 |
| 5,521,947 A * | 5/1996 | Madsen ..................... 375/375 |
| 5,523,724 A * | 6/1996 | Assar et al. ................ 331/1 A |
| 5,581,214 A * | 12/1996 | Iga ............................. 331/16 |
| 5,714,912 A * | 2/1998 | Fiedler et al. ............... 331/57 |
| 5,767,791 A * | 6/1998 | Stoop et al. .......... 340/870.11 |
| 5,842,029 A * | 11/1998 | Conary et al. ............. 713/322 |
| 6,009,319 A * | 12/1999 | Khullar et al. ............. 340/7.38 |
| 6,163,585 A * | 12/2000 | Yamawaki et al. ......... 375/373 |
| 6,169,912 B1 * | 1/2001 | Zuckerman ................. 455/570 |
| 6,215,362 B1 * | 4/2001 | Feng et al. .................. 331/17 |
| 6,226,274 B1 * | 5/2001 | Reese et al. ................ 370/280 |
| 6,265,947 B1 * | 7/2001 | Klemmer et al. ............ 331/17 |
| 6,407,600 B1 * | 6/2002 | Lu et al. ..................... 327/156 |
| 6,472,915 B1 * | 10/2002 | Moyal et al. ............... 327/157 |
| 6,522,204 B1 * | 2/2003 | Rennick ..................... 331/1 A |
| 6,608,510 B2 * | 8/2003 | Yamawaki et al. ......... 327/156 |
| 6,611,160 B1 * | 8/2003 | Lee et al. ................... 327/157 |
| 6,646,512 B2 * | 11/2003 | Abassi et al. ................ 331/17 |
| 6,765,977 B1 * | 7/2004 | Adams et al. .............. 375/376 |
| 6,788,924 B1 * | 9/2004 | Knutson et al. ............ 455/265 |
| 6,795,516 B1 * | 9/2004 | Takekawa et al. .......... 375/376 |
| 2002/0077074 A1 * | 6/2002 | Piazza ........................ 455/343 |
| 2002/0132598 A1 * | 9/2002 | Saito ....................... 455/183.1 |
| 2002/0159541 A1 * | 10/2002 | Tahtinen .................... 375/316 |
| 2003/0001681 A1 * | 1/2003 | Asikainen et al. ............ 331/18 |
| 2003/0006848 A1 * | 1/2003 | Cordoba ...................... 331/17 |
| 2003/0060176 A1 * | 3/2003 | Heinonen et al. .......... 455/255 |
| 2003/0189991 A1 * | 10/2003 | Puccio et al. .............. 375/326 |

\* cited by examiner

*Primary Examiner*—Edward F. Urban
*Assistant Examiner*—Christian A. Hannon
(74) *Attorney, Agent, or Firm*—Harrington & Smith, PC

(57) ABSTRACT

The invention relates to a circuit arrangement (4) for a PLL to be used in a terminal (50) of a time division cellular network. In a PLL according to the invention, the control voltage (32a) to a VCO (33) in the PLL is kept at a desired value also during time slots in which the terminal is not receiving or transmitting messages. The settling time for a PLL according to the invention is shot and the spurious effects caused by the power up thereof are small. The invention further relates to a method of operation for a PLL.

25 Claims, 6 Drawing Sheets

CIRCUIT ARRANGEMENT FOR PHASE LOCKED LOOP, AND PHASE LOCKED LOOP BASED METHOD TO BE USED IN CELLULAR NETWORK TERMINALS

The invention relates to a circuit arrangement for implementing a phase locked loop in a terminal of a time-division cellular network. This circuit arrangement comprises means for receiving an external signal and processing it into a reference signal, means for indicating a signal representative of a phase difference between said processed reference signal and a comparable signal generated in the circuit arrangement, means for producing through the use of said indicated signal a voltage change proportional to the phase difference, means for producing a variable-frequency output signal through the use of said voltage change proportional to the phase difference, and means for switching off power supply to at least one component in the phase locked loop circuit for the duration of time slots not utilized for data transfer. The invention further relates to a phase locked loop implementation based on an integrated circuit, time-division cellular network terminal using a phase locked loop, and to a method of operation for a phase locked loop.

Figure 1:
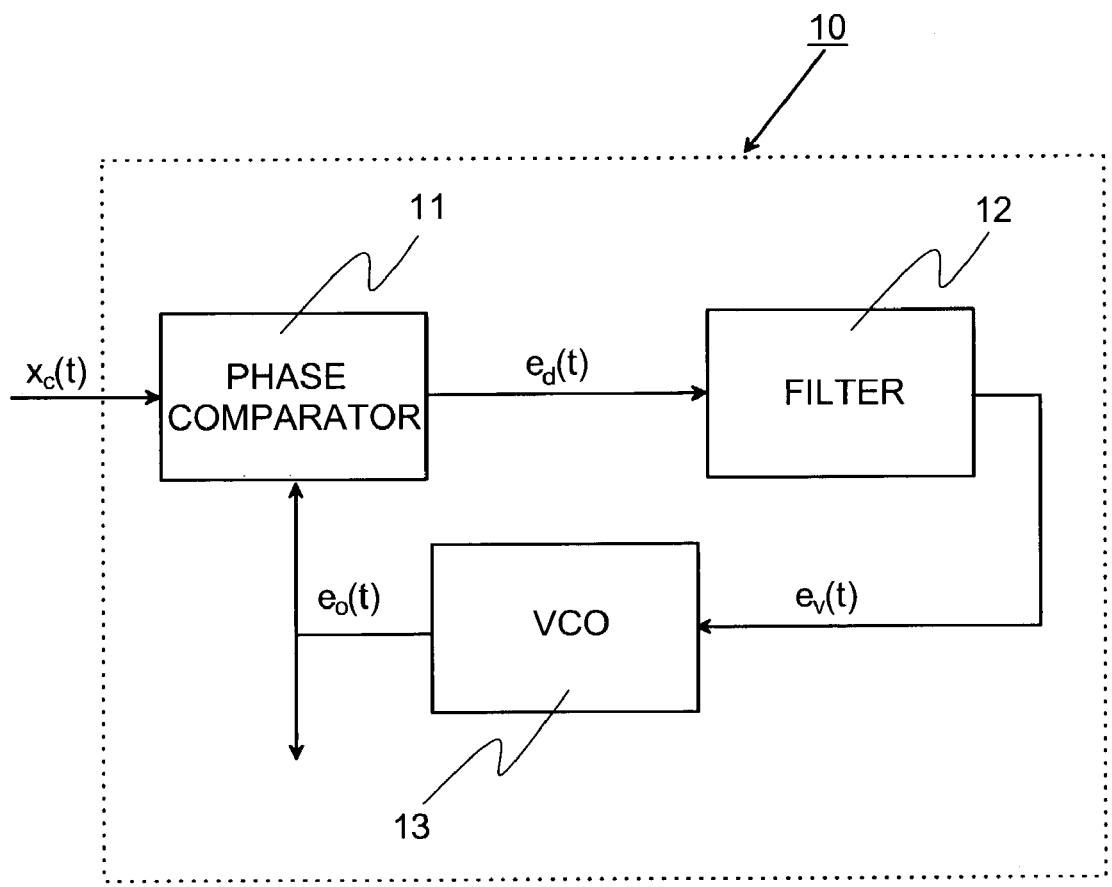

The phase locked loop or PLL for short, illustrated in FIG. 1, is widely used in various communication equipment. It is used to produce a signal $e_o(t)$ at a desired frequency and having the correct phase so that this signal can be utilized in the operation of the equipment in question. The signal can be used e.g. in transmitter and receiver functions of a communication device. A PLL circuit arrangement 10 according to FIG. 1 receives an external signal $x_c(t)$ the reference frequency of which is to be utilized in some way or another. The signal $x_c(t)$ is applied to a first input of a phase comparator 11. A signal $e_o(t)$ from a voltage controlled oscillator VCO 13 is connected to a second input of the same phase comparator 11. The phase comparator 11 produces a signal $e_d(t)$ which is proportional to the phase difference of these two signals and which is filtered in a low-pass filter 12. Between the phase comparator and low-pass filter there usually is placed a so-called charge pump, which is not shown in FIG. 1. The output signal $e_v(t)$ from the low-pass filter 12, substantially a dc voltage, is used to control the frequency and phase of the signal obtained from an output of the VCO 13. When the frequency and phase of the VCO output signal $e_o(t)$ correspond to those of the signal $x_c(t)$, the VCO output signal $e_o(t)$ stays locked to a certain constant frequency.

In time-division digital communication systems, a signal received or transmitted is not continuous. Such time-division communication systems include the Global System for Mobile Communications (GSM) and Terrestrial Trunked Radio (TETRA), for instance. In these communication systems, for example, the external signal $x_c(t)$ according to the example of FIG. 1 will be cut off when a time slot assigned to a given terminal comes to an end. Therefore, some or all of the circuit elements of the PLL circuit 10 can be switched off from time to time, if only allowed by the settling time of the circuit element in question. Upon arrival of the next time slot used by the terminal the PLL circuit 10 again powers up with all its circuit elements.

On the other hand, in mobile terminals of time-division cellular systems, in order to save the batteries of the terminal, the PLL or some of its circuit elements are switched off for the duration of the time slots in which the terminal is not transmitting or receiving. Especially switching off the VCO and the associated circuit elements in the PLL can considerably prolong the life of a battery of a terminal, which is highly desirable from the user's viewpoint. It is difficult to estimate in advance the time that a given terminal needs to be in operation, especially in the case of terminals used in networks operated by the various authorities such as the police and the like. Therefore, in order to achieve an operating time as long as possible, it is of utmost importance that a terminal connected to a network operates in a manner that conserves power.

A restart of a PLL circuit always takes a certain time which must not be too long. Furthermore, prior to the final re-locking of a PLL circuit 10 the signal $e_o(t)$ will contain a spurious component affecting the operation of the terminal, the magnitude of the spurious signal depending on the frequency of the reference signal $e_o(t)$ used in the phase comparison and the bandwidth of the low-pass filter used in the PLL circuit.

When the bandwidth of the low-pass filter and the frequency of the reference signal are close to each other in magnitude, the resulting spurious signal will be strong and it will modulate the VCO output frequency, attenuated only a little. Traditional attempts at solving this problem have included the approach of narrowing down the pass band of the low-pass filter. Generally, the bandwidth of the low-pass filter tends to be about 10 per cent of the reference signal frequency. In the TETRA system, for example, a 25-kHz reference signal used in the phase comparator is connected to a low-pass filter having a bandwidth of about 1 to 2.5 kHz. This, too, will cause a strong spurious effect at the moment of PLL restart. The spurious effect, depicted in the time domain in FIG. 2a and in the frequency domain in FIG. 2b, is so strong that it is not within system specifications. The spurious effect is caused by frequency correction pulses from the charge pump which modulate the VCO output frequency at phase detection frequency. This results in the VCO output frequency varying considerably for some time before locking to the correct frequency.

An object of the present invention is to reduce the spurious effects generated during the restart of a PLL used in mobile terminals utilizing time-division technology as well as the settling time of the PLL in applications where power supply to at least some of the circuit elements in the PLL is switched off in order to prolong the operational time of the batteries of the terminal.

The objects of the invention are achieved when, in a circuit arrangement according to the invention, a charge pump used in the control of a VCO in a PLL of a mobile terminal, and a low pass filter connected therewith, are driven into a desired charge state/voltage for the duration of time slots not used in data transfer while at the same time switching off power supply to other circuit elements in the PLL, advantageously including the VCO, in order to extend the life of the batteries. With the method according to the invention, the frequency of the VCO in the PLL settles rapidly at power-up as the control voltage of the VCO is set in advance close to the control voltage of the stable lock condition. Spurious effects generated at power-up will be smaller and the settling time of the PLL shorter than with a method according to the prior art, because the output frequency of the VCO does not need to start the locking process from an arbitrary frequency value far away from the lock frequency.

An advantage of the invention is that the operational time of batteries of a terminal is maximized.

Another advantage of the invention is that spurious signals generated in a PLL in conjunction with its restart are smaller than with a method according to the prior art.

Yet another advantage of the invention is that in a PLL the frequency of the VCO output signal is close to the lock frequency immediately after the restart.

A further advantage of the invention is that the settling time of a PLL is shorter than in methods according to the prior art.

A PLL according to the invention, which is used in a mobile terminal, is characterized in that an operating voltage is arranged so as to be connected to a means, within the PLL, for generating a voltage change proportional to a phase difference also during time slots not used for data transfer in order to reduce the power-up time and switching noise in the PLL circuit.

A method of operation of a PLL according to the invention, which is used in a mobile terminal, is characterized in that the operating voltage to the means controlling the frequency of an output signal of a VCO in a PLL in the terminal is not switched off for the duration of time slots not used for data transfer, in order to reduce the power-up time and switching noise in the PLL circuit.

Preferred embodiments of the invention are specified in the dependent claims.

The basic idea of the invention is as follows: a PLL in a mobile terminal must be optimized as regards both the energy consumption and the functional characteristics required by the terminal. In order to save the batteries in the terminal the PLL and above all its VCO, which consumes a lot of energy, must be advantageously switched off for the duration of time slots in which the terminal is not receiving or transmitting messages. This prolongs the operational time of the batteries in the terminal. In the method according to the invention, the low-pass filter, which is used in VCO control, with its charge pump is, however, always kept operational. The output voltage of the low-pass filter is set to a desired voltage while power supply to the other circuit elements in the PLL is advantageously switched off. Said desired output voltage of the low-pass filter is of a magnitude which is required for driving the VCO frequency of the PLL to the correct locking frequency immediately when the next data transfer time slot assigned to the terminal starts. With the method according to the invention, the PLL settles quickly to the correct frequency after power-up and, additionally, the spurious effects caused by the power-up stay smaller than using a method according to the prior art.

Figure 4A:
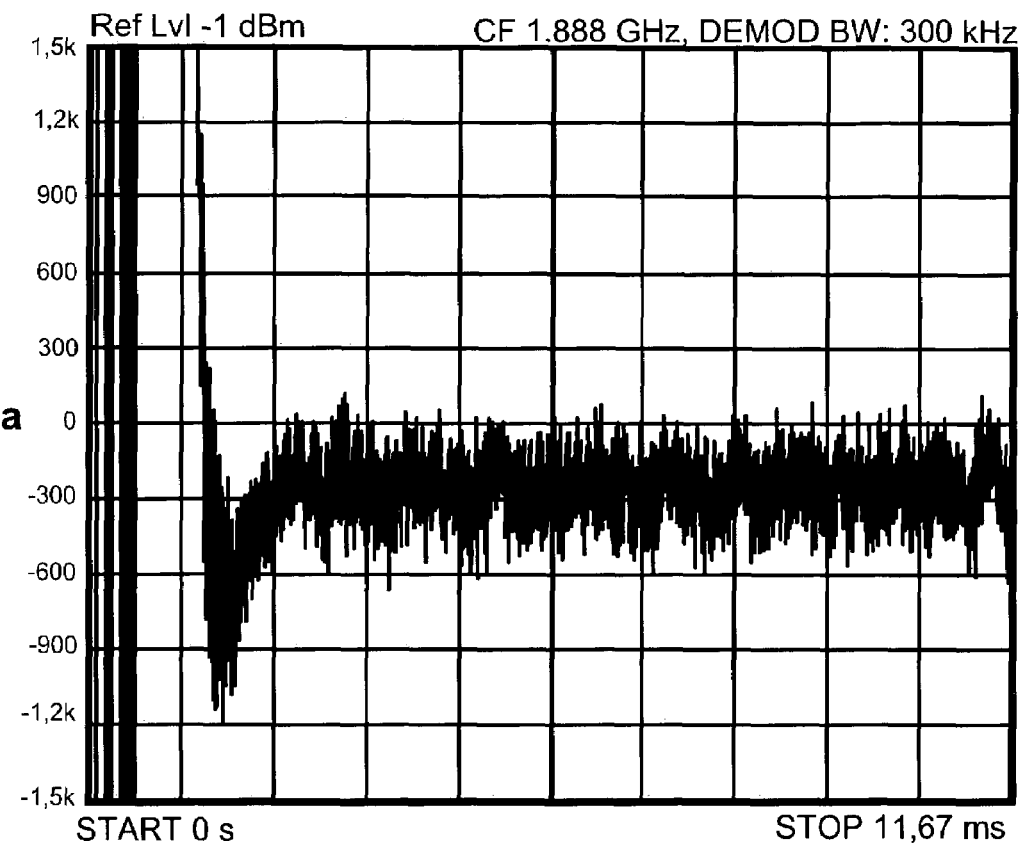
Figure 4B:
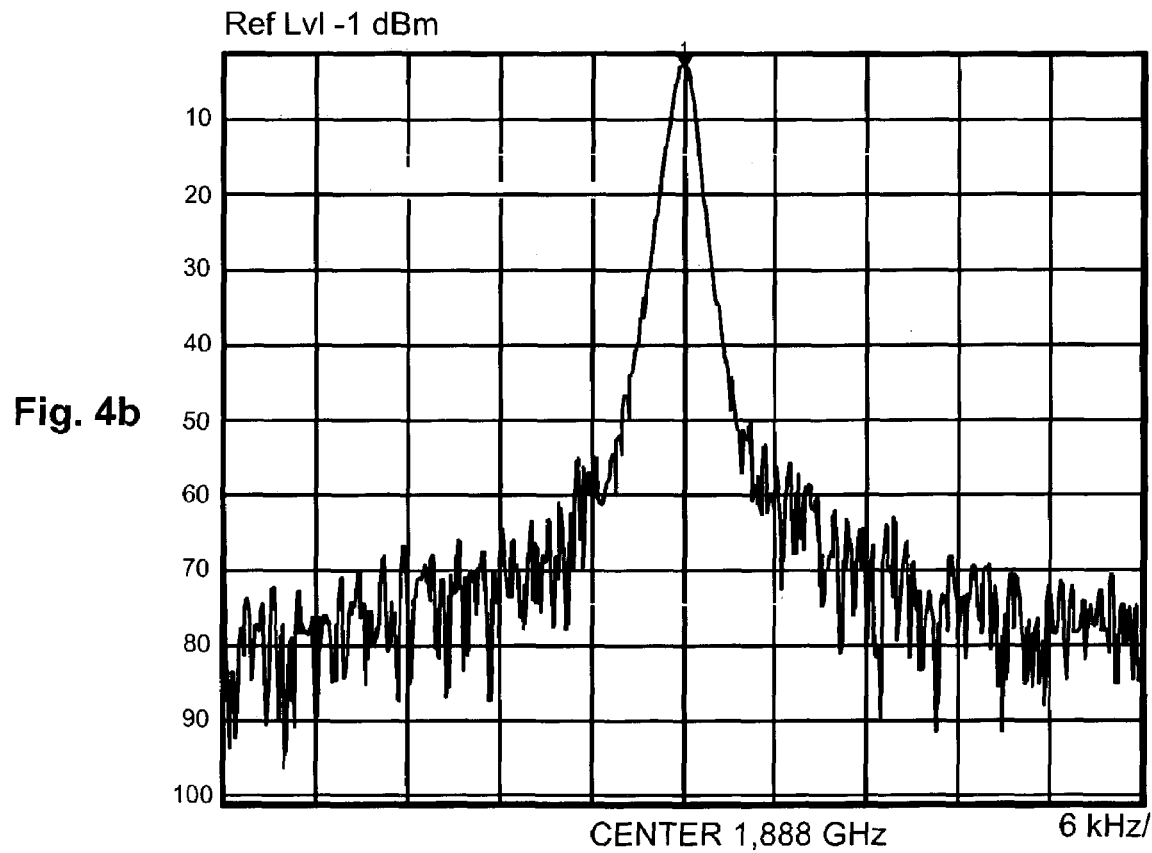
Figure 5:
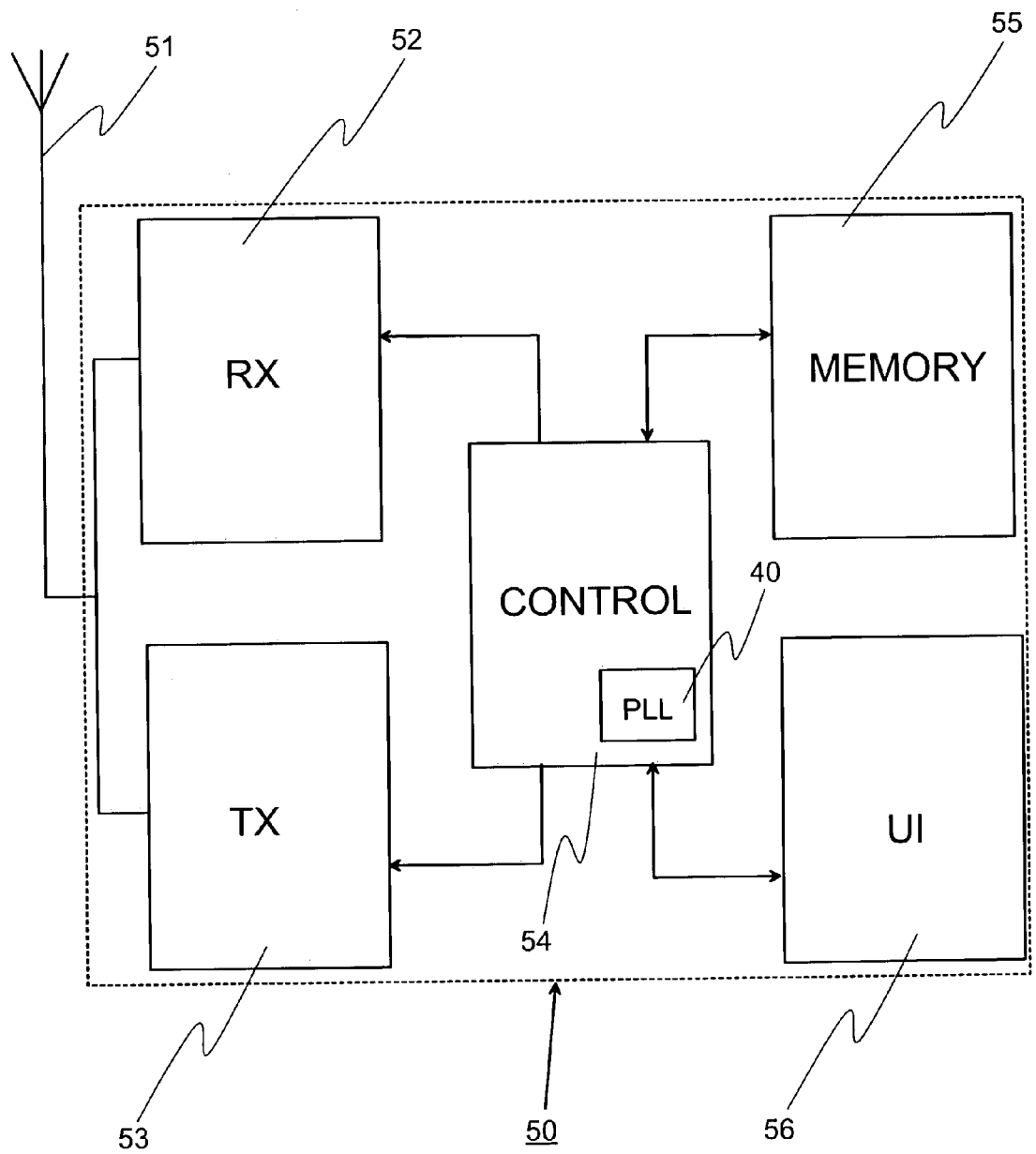
Figure 6:
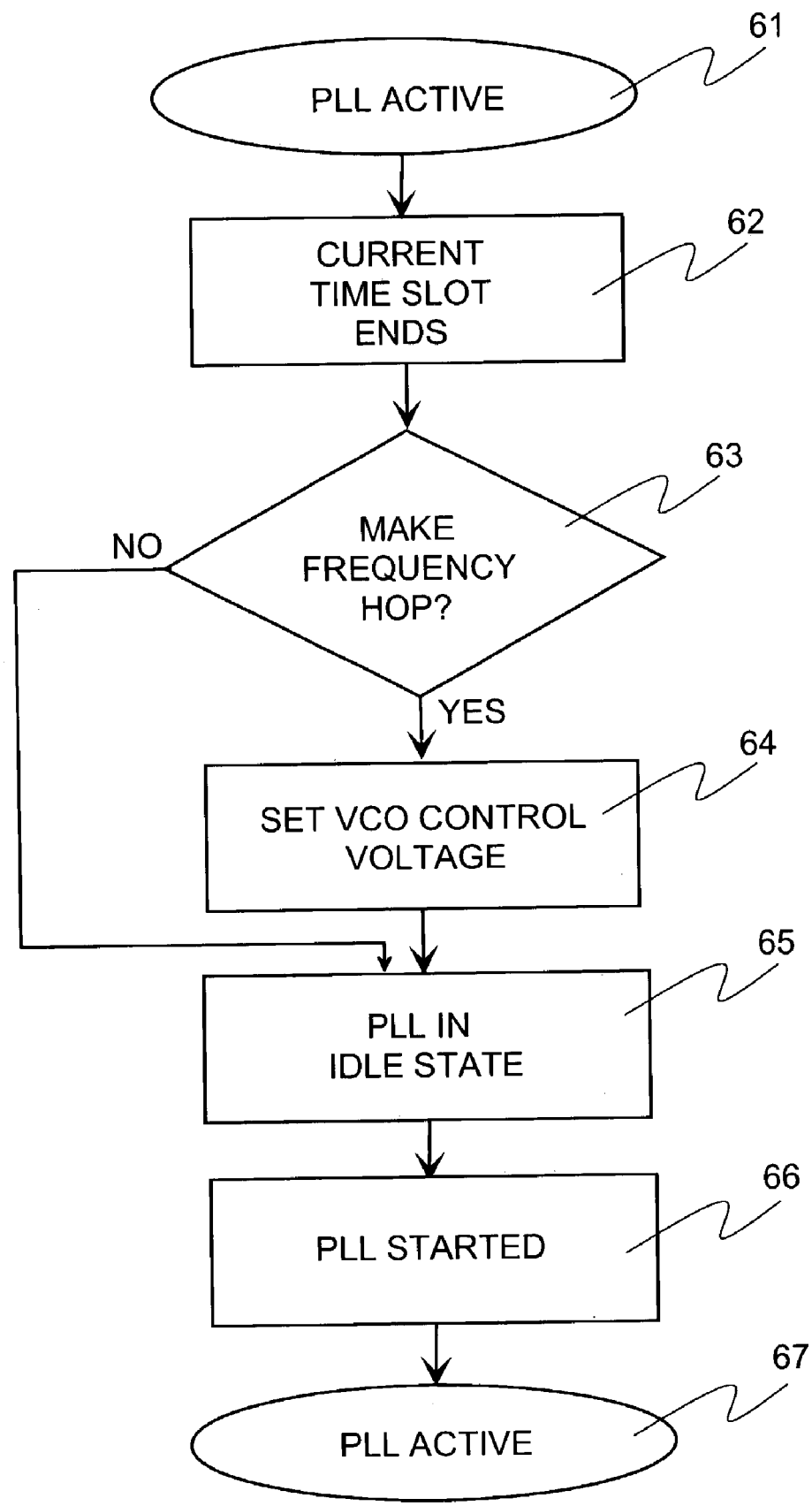

The invention is below described in detail. The description refers to the accompanying drawings wherein FIG. 1 schematically shows an example of a PLL, FIG. 2a shows a VCO output of a PLL according to the prior art in the time domain, FIG. 2b shows a VCO output of a PLL according to the prior art in the frequency domain, FIG. 3 shows, as an example, the essential functional components of a PLL circuit according to the invention, FIG. 4a shows a VCO output of a PLL according to the invention in the time domain, FIG. 4b shows a VCO output of a PLL according to the invention in the frequency domain, FIG. 5 shows, as an example, a block diagram of a terminal in a time-division cellular network, which terminal employs a PLL according to the invention, and FIG. 6 shows, as an example, a flow diagram of the main steps of operation of a PLL arrangement according to the invention.

Figure 2A:
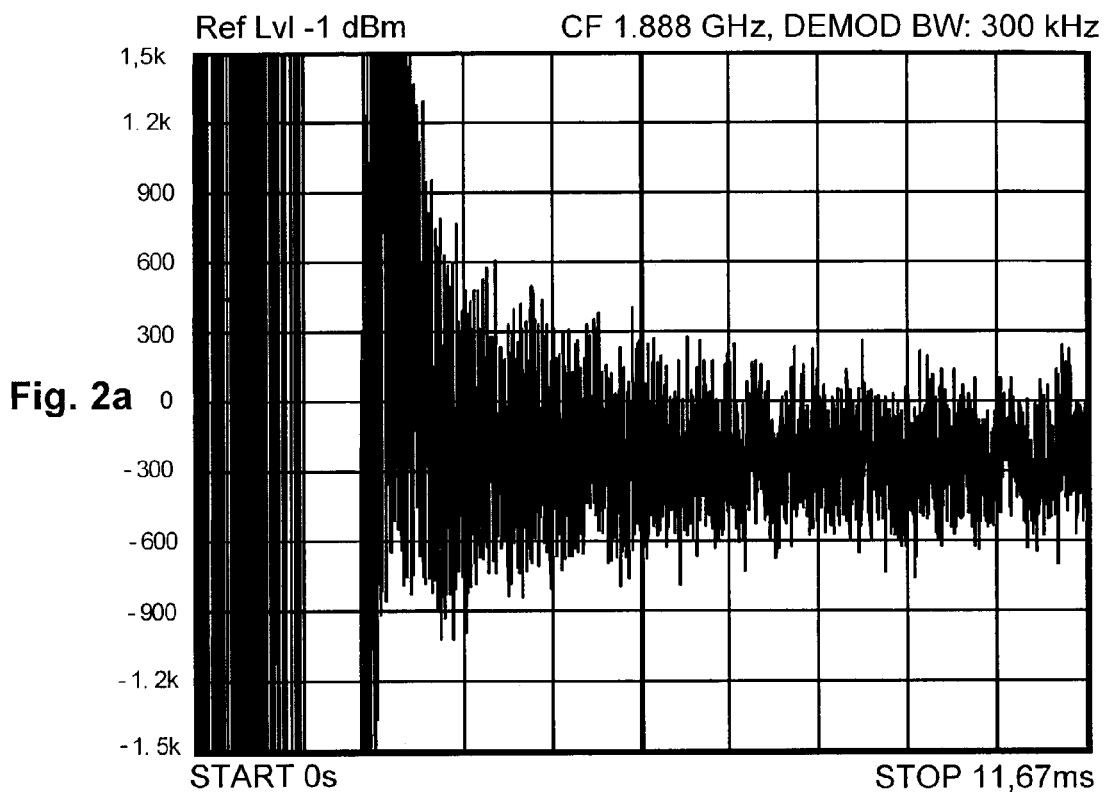
Figure 2B:
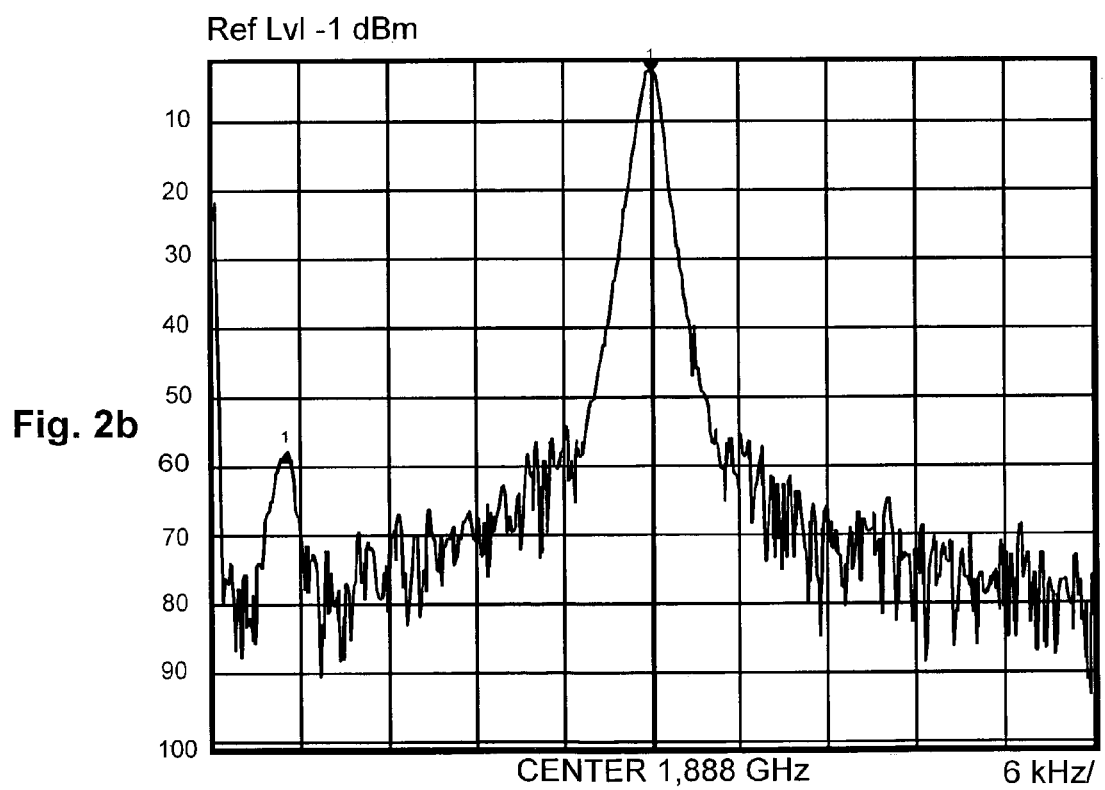

FIGS. 1, 2a and 2b were discussed in conjunction with the description of the prior art.

Figure 3:
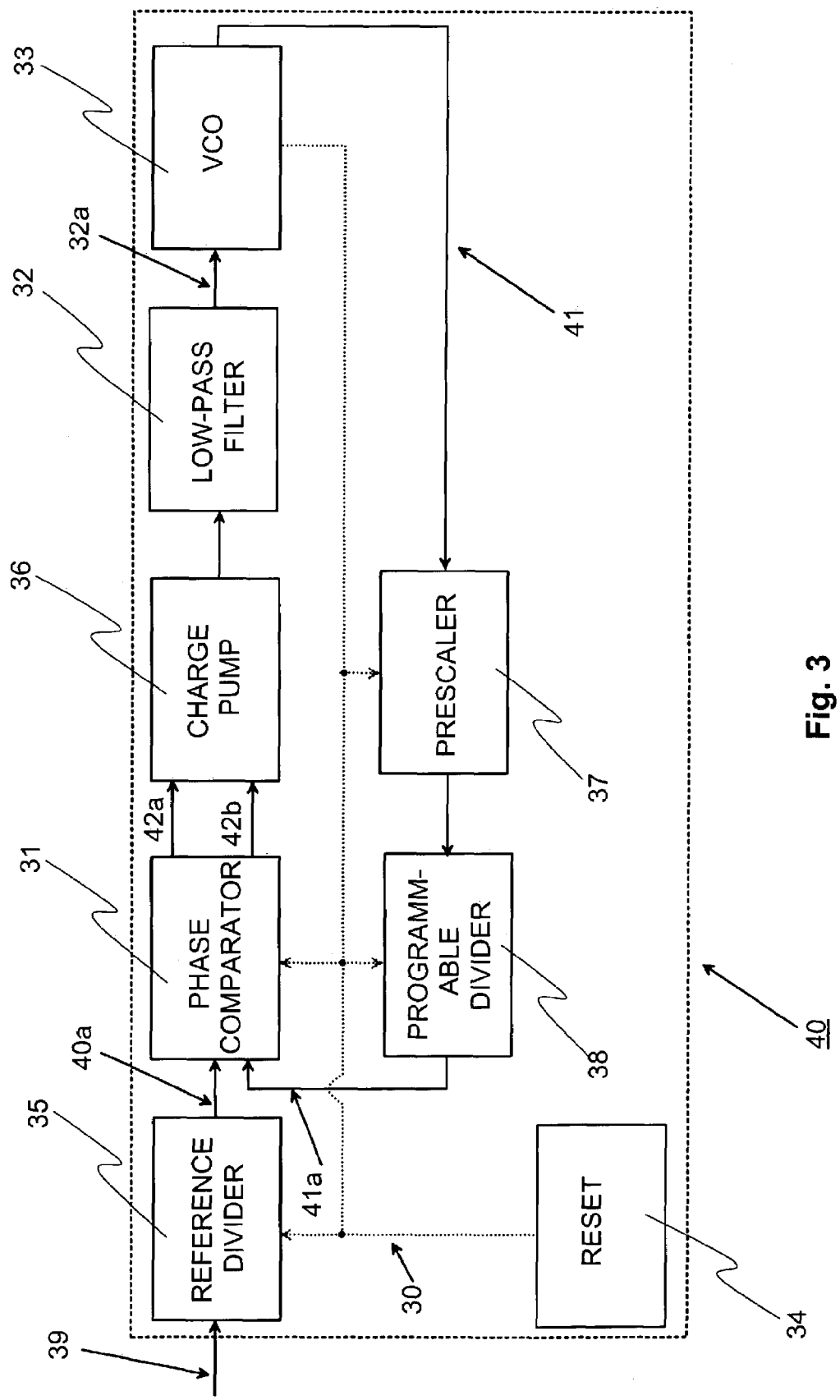

FIG. 3 shows, as an example, the main functional components of a PLL 40 according to the invention, which PLL is used in mobile terminals. A circuit according to the example of FIG. 3 can be used e.g. to realize a PLL circuit utilized in the terminals of a TETRA network.

Reference number 39 represents a clock signal brought to the PLL from an external source, the frequency of the signal being in this exemplary case 16.2 MHz. The clock signal 39 is divided by a reference divider 35 so that the reference divider outputs a reference signal 40a on the order of 25 kHz. This reference signal 40a is applied to a first input of a phase comparator 31. To a second input of the phase comparator 31 there is brought from a VCO a comparable signal 41a, advantageously shaped by one or more dividers 37, 38 from a VCO output signal 41. The phase comparator 31 has two outputs: a lead output 42a and a lag output 42b. If the phase of the comparable signal 41a coming from the VCO lags with respect to the phase of the reference signal 40a, the lag output 42b is active. The lag output 42b then outputs positive voltage pulses which the charge pump 36 forwards to a low-pass filter 32 causing the output voltage 32a of the latter to rise. If the phase of the comparable signal 41a is leading that of the reference signal 40a, the lead output 42a is active. The lead output 42a feeds negative voltage pulses via the charge pump 36 to the low-pass filter 32 causing its output voltage 32a to fall.

The signal at the charge pump 36 output is connected to the low-pass filter 32. The low-pass filter 32 can be implemented with a passive or active circuit according to the prior art. In the exemplary circuit of FIG. 3, the bandwidth of the low-pass filter 32 used in a TETRA network terminal is about 10% of the reference signal, or on the order of 2 kHz.

Output voltage level 32a of the signal coming from the low-pass filter 32 controls the operation of the VCO 33. A rise in the filter output voltage increases the frequency of the output signal 41 at the output of the VCO 33. In this exemplary case the VCO output signal 41 may vary within the frequency range of 1.5 to 3 GHz.

The output voltage 41 obtained from the VCO 33 is first applied to a 64/65 prescaler 37 with an advantageously fixed divide ratio, from which the result of the division is further taken to an advantageously programmable divider 38. The programmable divider 38 gives a division result, i.e. the comparable signal 41a the frequency of which is on the order of 25 kHz. This is applied to a second input of the phase comparator 31.

The circuit arrangement according to the invention further comprises a RESET circuit 34. It is used to power down selected circuit elements of the PLL 40 at times when the terminal is not transmitting or receiving. In the circuit arrangement according to the invention, advantageously the reference divider 35, phase comparator 31, VCO 33, prescaler 37, and the programmable divider 38 are powered down. In the solution according to the invention, power to the charge pump 36 is not completely switched off but the supply voltage stays connected to the charge pump 36 at all times. Only the so-called bias current is switched off. This way, the output of the charge pump 36 stays unchanged in a high-impedance state without consuming power, except for small leakage currents. Thus the output voltage 32a of the low-pass filter 32 will not change either. This ensures that the control voltage 32a of the VCO 33 is already at a desired level at the moment when the PLL circuit 40 is restarted.

In order to minimize spurious effects it is advantageous to drive the voltage 32a at the low-pass filter 32 output about 100 to 200 mV above the estimated VCO control voltage value required in the next time slot to be used. Thus at the beginning of a new time slot the VCO output frequency is at the upper side of the selected frequency band as the VCO starts. From there it quickly goes to the desired frequency as the VCO starts.

In an advantageous embodiment according to the invention, the voltage $32a$ of the low-pass filter 32 output is driven to the operating voltage of the charge pump 36 before the next allocated time slot. In this advantageous embodiment, changes in temperature, for instance, or other environmental factors cannot have adverse effects at the moment when the PLL restarts.

FIGS. $4a$ and $4b$ show situations corresponding to FIGS. $2a$ and $2b$ with a PLL according to the invention in use. FIG. $4a$ shows that the settling time of the PLL circuit is shorter and the spurious level is clearly lower than in the circuit arrangement according to the prior art. FIG. $4b$ shows that, unlike in FIG. $2b$, no spurious effects are caused on adjacent channels when examining the output of the PLL circuit 33 in the frequency domain.

Time-division based communication devices can utilize so-called frequency hopping. This means receiving or transmitting information in different time slots always at a frequency different than the preceding frequency. This frequency hop pattern is always known by the transmitter and receiver. The circuit arrangement according to the invention can be used to enhance the performance of a communication device in the following manner. A terminal knows the next frequency to be used in the next allocated time slot after a frequency hop. In a first advantageous embodiment of the invention the output voltage $32a$ of the filter 32 is set by a charge pump 36, at the end of the preceding time slot, close to the control voltage $32a$ of the VCO 33 used by the next allocated time slot. In a second advantageous embodiment of the invention, this setting of the control voltage $32a$ is done immediately before the beginning of the next allocated time slot by switching on the bias current to the charge pump 36. This is possible because the operating voltage of the charge pump 36 is not switched off. In both embodiments, the VCO quickly settles down to the desired new frequency after a frequency hop because it does not need to start its pursuit of the desired operating frequency from an arbitrary value.

The exemplary circuit arrangement for a PLL 40 shown in FIG. 3 can be implemented as part of a terminal 50, shown in FIG. 5, either in discrete components or as part of an integrated circuit (IC) used therein.

The PLL 40 according to the invention is advantageously applied in time-division cellular network terminals 50 according to FIG. 5. Otherwise the terminals used may be prior-art devices the main functional components of which are shown in the exemplary block diagram of FIG. 5. A cellular network terminal 50 uses an antenna 51 for both transmission and reception. Reference number 52 represents the means that constitute the receiver RX of the terminal 50 by means of which the wireless terminal 50 receives messages from the cellular network. The receiver RX comprises prior-art means for all signal processing functions carried out on the received signals.

Reference number 53 represents the means that constitute the transmitter TX of the wireless terminal 50. The transmitter means 53 carry out on the transmitted signal all the signal processing functions required for communicating with a cellular network.

Operation of the wireless terminal 50 is controlled by a control unit 54 (CONTROL). It controls the operation of all the main components in the terminal 50. It controls both reception and transmission. It is also used for controlling the user interface (UI) 56 and memory 55 (MEMORY) of the terminal 50.

One or more PLL circuits 40 according to the invention form advantageously part of the control unit 54 in the terminal 50. Signals obtained from the PLLs can be utilized in the operation of either the transmitter or receiver. When using two PLL circuits, one for transmission and the other for reception, the PLL settling times will not be a problem. Thus it is possible to switch off the power supply to certain elements of the PLL circuit in order to prolong the operational time of the terminal.

FIG. 6 shows in an exemplary flow diagram the different stages of operation of a PLL according to the invention. In the example of FIG. 6, the process starts at step 61 in which the PLL 40 is active. In this situation the terminal 50 is either receiving or transmitting during the current time slot. In step 62 the time slot assigned to the terminal comes to an end. In step 63 it is checked whether the terminal uses frequency hopping. If frequency hopping is not used, the process moves on to step 65 in which the RESET circuit is activated and sets advantageously at least some of the components of the PLL 40 in an idle state for the duration of the time slots in which the terminal is not receiving or transmitting. In the idle state, the components of the PLL 40 are mainly powered down. Only the charge pump 36 in the PLL is supplied power. The bias current to the charge pump 36 is, however, advantageously switched off. This way, the output voltage of the low-pass filter 32 stays at a level where it was set at the end of step 62 also for the duration of time slots not used for data transfer. However, the bias current to the charge pump 36 may be switched back on already before the next time slot used. The output voltage of the charge pump 36 can thus be pre-set to the desired level.

If the terminal uses frequency hopping, step 63 is followed by step 64 in which the control unit 54 of the terminal sets, through the charge pump 36, the low-pass filter 32 output voltage $32a$ such that in the next allocated time slot the VCO 33 quickly settles to the next operating frequency.

After that, in step 65, the RESET circuit 34 shown in FIG. 3 is activated. It switches off the power supply to most of the components in the PLL circuit 40. The operating voltages of the charge pump 36 are not, however, switched off. Its bias current, on the other hand, is. Because of the switching-off of the bias current the output of the charge pump is in a high-impedance stable state with only a small leakage current flowing. This way, the output voltage $32a$ of the low-pass filter 32 stays nearly the same for the whole time that the PLL 40 is in the idle state, step 65. The bias current of the charge pump 36 is switched back on at the moment when the voltage at its output is to be controlled again. This can be advantageously done during an unused time slot shortly before the next time slot used.

In step 66 the terminal is again using a time slot for either reception or transmission. Therefore, the RESET circuit 34 is no longer active and power is again supplied to all components in the PLL 40. Since the VCO 33 input control voltage $32a$ is close to the anticipated value, it quickly settles at the correct frequency and locks to it rapidly at the beginning of the time slot.

In step 67 the process has returned to a situation where the PLL 40 is locked to the desired frequency.

Some embodiments according to the invention were described above. The invention is not limited to the embodiments described. The inventional idea can be applied in numerous ways within the scope defined by the claims.

The invention claimed is:

1. A circuit arrangement for implementing a PLL in a time-division cellular network terminal in which power supply to at least some of the circuit elements of the terminal is arranged to be switched off for the duration of time slots not used in data transfer, comprising:
   means for receiving an external signal and processing it into a reference signal,
   means for indicating a signal representing a phase difference between said processed reference signal and a comparable signal generated in the circuit arrangement,
   means for producing, using said indicated signal, a voltage change proportional to the phase difference,
   a voltage controlled oscillator (VCO), for producing, on the basis of said voltage change proportional to the phase difference, an output signal having a varying frequency, and
   means for switching off power supply of the VCO in the PLL for the duration of time slots not used in data transfer,
   in which circuit arrangement a power supply voltage is arranged to be connected to the means for producing a voltage change proportional to the phase difference also during time slots not used in data transfer in order to reduce the restart time and switching noise in the PLL, wherein the means for producing an output signal having a varying frequency comprise a VCO which is arranged to be controlled using a control voltage obtained from an output of a low-pass filter, and
   wherein the initial value of the VCO control voltage obtained from an output of a low-pass filter is arranged to be set, at the end of each time slot used in data transfer, to a voltage value which is 100 to 200 mV above the VCO control voltage to be used in the next time slot used in data transfer.

2. A circuit arrangement for implementing a PLL in a time-division cellular network terminal in which power supply to at least some of the circuit elements of the terminal is arranged to be switched off for the duration of time slots not used in data transfer, comprising:
   means for receiving an external signal and processing it into a reference signal,
   means for indicating a signal representing a phase difference between said processed reference signal and a comparable signal generated in the circuit arrangement,
   means for producing, using said indicated signal, a voltage change proportional to the phase difference,
   a voltage controlled oscillator (VCG), for producing, on the basis of said voltage change proportional to the phase difference, an output signal having a varying frequency, and
   means for switching off power supply of the VCO in the PLL for the duration of time slots not used in data transfer,
   in which circuit arrangement a power supply voltage is arranged to be connected to the means for producing a voltage change proportional to the phase difference also during time slots not used in data transfer in order to reduce the restart time and switching noise in the PLL, wherein the means for producing an output signal having a varying frequency comprise a VCO which is arranged to be controlled using a control voltage obtained from an output of a low-pass filter, and
   wherein the initial value of the VCO control voltage obtained from an output of a low-pass filter is arranged to be set, prior to the beginning of the next time slot used in data transfer, to a voltage value which is 100 to 200 mV above the VCO control voltage to be used in the next time slot used in data transfer.

3. A method for reducing the restart time and switching noise in a PLL circuit of a terminal used in a time-division cellular network, where:
   at least a power supply of a VCO of the PLL is switched off for the duration of time slots not used in data transfer;
   a power supply of a means controlling the frequency of an output signal of the VCO is not switched off for the duration of time slots not used for data transfer;
   the power supply of the PLL and the VCO is switched on as a time slot assigned to the terminal for data transfer starts, and;
   for the duration of a time slot assigned to data transfer the VCO operates at a frequency determined by a voltage value set at its control input
   wherein as a time slot assigned to data transfer comes to an end, power supply to a reference divider, prescaler, programmable divider, and a phase comparator in the PLL is switched off as well.

4. A method for reducing the restart time and switching noise in a PLL circuit of a terminal used in a time-division cellular network, where:
   at least a power supply of a VCO of the PLL is switched off for the duration of time slots not used in data transfer;
   a power supply of a means controlling the frequency of an output signal of the VCO is not switched off for the duration of time slots not used for data transfer;
   the power supply of the PLL and the VCO is switched on as a time slot assigned to the terminal for data transfer starts, and;
   for the duration of a time slot assigned to data transfer the VCO operates at a frequency determined by a voltage value set at its control input, wherein as a time slot assigned to data transfer comes to an end, a target value is determined for the VCO control voltage to be used in the next time slot used in data transfer and
   wherein the control voltage determining the frequency of the VCO output signal is set to a value which is 100 to 200 mV above that used in the next time slot used in data transfer.

5. A phase locked loop, comprising:
   a phase comparator configured to compare an input signal to a reference signal to generate an output indicative of a difference in phase between the input signal and the reference signal;
   a charge pump responsive to the output of the phase comparator to generate an output signal;
   a voltage controlled oscillator responsive to the output of the charge pump to generate an output signal having a frequency related to the output signal of the charge pump, and
   control circuitry configured to switch off a power supply voltage of said phase comparator and voltage controlled oscillator during a period of non-use, where a power supply voltage of said charge pump is not switched off during the period of non-use and where a bias current of said charge pump is switched off during the period of non-use to cause said output of said charge pump to assume a high impedance state during the period of non-use and to reduce power consumption of said charge pump.

6. The phase locked loop of claim 5, where said output of said charge pump is coupled to said voltage controlled oscillator via a filter, and where during the period of non-use an output voltage of said filter remains substantially constant.

7. The phase locked loop of claim 5, where the reference signal is derived from an output of said phase locked loop.

8. The phased locked loop as in claim 5, embodied in an integrated circuit.

9. The phased locked loop as in claim 5, embodied in a wireless terminal, where the period of non-use corresponds to a time when the wireless terminal is at least one of not receiving or transmitting.

10. The phased locked loop as in claim 5, embodied in a wireless terminal configured for use in a time divisional wireless network, where the period of non-use comprises at least one time slot when the wireless terminal is not receiving from the wireless network.

11. The phased locked loop as in claim 5, embodied in a wireless terminal configured for use in a time divisional wireless network, where the period of non-use comprises at least one time slot when the wireless terminal is not transmitting to the wireless network.

12. A phase locked loop (PLL) circuit, comprising:
a signal generator responsive to an external signal to output a reference signal;
a difference determining circuit configured to output a signal representing a phase difference between the reference signal and another signal;
a voltage circuit that outputs, in response to the output of said difference determining circuit, a voltage that has a value related to the phase difference,
a voltage controlled oscillator (VCO) configured to respond to a control voltage obtained from the voltage to output a signal having a frequency that is a function of the control voltage; and
switching circuitry configured to switch off a power supply voltage of the VCO for a duration of time slots not used for data transfer in a time-division cellular network,
where the power supply voltage is not switched off to the voltage circuit during those time slots not used in data transfer to reduce a restart time and to reduce switching noise of the PLL circuit.

13. The PLL circuit of claim 12, where said voltage circuit comprises a low-pass filter.

14. The PLL circuit of claim 13, where a bandwidth of the low-pass filter is less than about 10% of the frequency of the reference signal.

15. The PLL circuit of claim 13, where said voltage circuit further comprises a charge pump having an output coupled to the low-pass filter.

16. The PLL circuit of claim 15, where the output of the charge pump is configured to enter a high-impedance state to prevent a discharge of the low pass filter during a time slot not used in data transfer.

17. The PLL circuit of claim 12, where said control voltage is obtained from an output of a low pass filter.

18. The PLL circuit of claim 12, where the control voltage is set, at the end of a time slot used for data transfer, to a voltage value that is substantially equal to an initial value of the control voltage to be used in a next time slot used for data transfer.

19. The PLL circuit of claim 12, where the control voltage is set, prior to a beginning of a next time slot used for data transfer, to a voltage value that is substantially equal to an initial value of the control voltage to be used in the next time slot used for data transfer.

20. The PLL circuit of claim 12, where the control voltage is set, at a time prior to a beginning of a next time slot used for data transfer, to a voltage value that is greater than an estimated initial value of the control voltage to be used in the next time slot used for data transfer.

21. The PLL circuit of claim 12, where the control voltage is set, at a time prior to a beginning of a next time slot used for data transfer, to a voltage value that is about 100 mV to about 200 mV greater than an estimated initial value of the control voltage to be used in the next time slot used for data transfer.

22. The PLL circuit of claim 12, where the control voltage is set, at a time prior to a beginning of a next time slot used for data transfer, to a voltage value that is predetermined to cause said VCO to generate a frequency in the next time slot used for data transfer that is substantially equal to a frequency used in a last time slot used for data transfer.

23. The PLL circuit of claim 12, where the control voltage is set, at a time prior to a beginning of a next time slot used for data transfer, to a voltage value that is predetermined to cause said VCO to generate a frequency in the next time slot used for data transfer that is different than a frequency used in a last time slot used for data transfer.

24. The PLL circuit of claim 12, embodied at least partially in an integrated circuit.

25. The PLL circuit of claim 12, embodied in a terminal configured for use in the time-division cellular system.

* * * * *

UNITED STATES PATENT AND TRADEMARK OFFICE
CERTIFICATE OF CORRECTION

| | | |
|---|---|---|
| PATENT NO. | : 7,283,801 B2 | Page 1 of 1 |
| APPLICATION NO. | : 10/429493 | |
| DATED | : October 16, 2007 | |
| INVENTOR(S) | : Suhonen | |

It is certified that error appears in the above-identified patent and that said Letters Patent is hereby corrected as shown below:

In Claim 2: Column 7, line 47, delete "VCG" and replace with --VCO--.

Signed and Sealed this

First Day of April, 2008

JON W. DUDAS
*Director of the United States Patent and Trademark Office*